United States Patent
Kuo et al.

(10) Patent No.: US 11,489,089 B2
(45) Date of Patent: Nov. 1, 2022

(54) LIGHT EMITTING DEVICE WITH TWO VERTICALLY-STACKED LIGHT EMITTING CELLS

(71) Applicant: Lextar Electronics Corporation, Hsinchu (TW)

(72) Inventors: Shiou-Yi Kuo, Hsinchu (TW); Jian-Chin Liang, Hsinchu (TW); Chien-Nan Yeh, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 253 days.

(21) Appl. No.: 16/907,143

(22) Filed: Jun. 19, 2020

(65) Prior Publication Data

US 2021/0399168 A1     Dec. 23, 2021

(51) Int. Cl.
*H01L 33/08* (2010.01)
*H01L 33/42* (2010.01)
*H01L 33/22* (2010.01)
*H01L 33/62* (2010.01)

(52) U.S. Cl.
CPC .............. *H01L 33/08* (2013.01); *H01L 33/22* (2013.01); *H01L 33/42* (2013.01); *H01L 33/62* (2013.01)

(58) Field of Classification Search
CPC ........................ H01L 33/08; H01L 25/0756
See application file for complete search history.

(56) References Cited

U.S. PATENT DOCUMENTS

| | | | |
|---|---|---|---|
| 6,563,139 B2 | 5/2003 | Hen | |
| 6,822,991 B2 | 11/2004 | Collins et al. | |
| 7,642,560 B2 | 1/2010 | Ogihara | |
| 8,003,974 B2 | 8/2011 | Heidborn et al. | |
| 8,035,115 B2 | 10/2011 | Ogihara et al. | |
| 8,058,663 B2 | 11/2011 | Fan et al. | |
| 8,089,074 B2 | 1/2012 | Kim et al. | |
| 8,258,533 B2 | 9/2012 | Seo et al. | |
| 8,283,684 B2 | 10/2012 | Windisch et al. | |
| 8,643,048 B2 | 2/2014 | Hwang | |
| 8,735,910 B2 * | 5/2014 | Kang | H01L 33/385 257/E33.012 |

(Continued)

FOREIGN PATENT DOCUMENTS

| | | |
|---|---|---|
| CN | 101335287 A | 12/2008 |
| CN | 102347344 A | 2/2012 |

(Continued)

*Primary Examiner* — Stephen M Bradley

(74) *Attorney, Agent, or Firm* — CKC & Partners Co., LLC

(57) ABSTRACT

A light emitting device includes a first light emitting cell and a second light emitting cell. Each light emitting cell includes a first semiconductor layer, a second semiconductor layer, and an active layer between the first and second semiconductor layers. The second semiconductor layer of the second light emitting cell has an exposed surface. A transparent bonding layer is located between the first and second light emitting cells. A hole is formed on the first and second light emitting cells and the transparent bonding layer. A first route metal is located on a sidewall of the hole and electrically coupled to the second semiconductor layer of the first light emitting cell and the first semiconductor layer of the second light emitting cell. The active layer of the second light emitting cell has an area greater than the active layer of the first light emitting cell.

19 Claims, 4 Drawing Sheets

(56) References Cited

U.S. PATENT DOCUMENTS

| | | | |
|---|---|---|---|
| 8,901,582 B2 | 12/2014 | Kang et al. | |
| 9,450,017 B2 | 9/2016 | Han | |
| 2009/0001389 A1 | 1/2009 | Wang et al. | |
| 2011/0204376 A1 | 8/2011 | Su et al. | |
| 2019/0189596 A1* | 6/2019 | Chae | H01L 33/08 |
| 2020/0058825 A1* | 2/2020 | Jang | H01L 33/62 |
| 2021/0050485 A1* | 2/2021 | Check | H01L 33/42 |

FOREIGN PATENT DOCUMENTS

| | | |
|---|---|---|
| CN | 109768135 A | 5/2019 |
| DE | 102008053731 A1 | 5/2010 |
| KR | 101869553 B1 | 7/2018 |
| KR | 101877396 B1 | 8/2018 |
| KR | 101931798 B1 | 12/2018 |

* cited by examiner

LIGHT EMITTING DEVICE WITH TWO VERTICALLY-STACKED LIGHT EMITTING CELLS

BACKGROUND

Field of Invention

The present disclosure relates to a light emitting device.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

As high-voltage LEDs are needed in the market, it is urgent to properly combine multiple LEDs to provide a high efficiency LED.

SUMMARY

One aspect of the present disclosure is to provide a light emitting device including a first light emitting cell and a second light emitting cell. Each light emitting cell includes a first semiconductor layer, a second semiconductor layer, and an active layer between the first semiconductor layer and the second semiconductor layer, wherein the second semiconductor layer of the second light emitting cell has an exposed surface to serve as a light output surface. A transparent bonding layer is located between the first light emitting cell and the second light emitting cell. A hole is formed on the first light emitting cell, the transparent bonding layer and the second light emitting cell. A first route metal is located on a sidewall of the hole and electrically coupled to the second semiconductor layer of the first light emitting cell and the first semiconductor layer of the second light emitting cell, wherein the active layer of the second light emitting cell has an area greater than that of the active layer of the first light emitting cell.

In one or more embodiments, the active layer of the second light emitting cell is closer to the exposed surface than the active layer of the first light emitting cell.

In one or more embodiments, a first metal pad and a second metal pad are both located over the first semiconductor layer of the first light emitting cell, and the second metal pad is spaced from the first metal pad and adjacent to the hole.

In one or more embodiments, a second route metal is spaced from the first route metal and electrically coupled to the second metal pad and the second semiconductor layer of the second light emitting cell.

In one or more embodiments, an electrical insulation layer is located between the first route metal and the second route metal.

In one or more embodiments, the electrical insulation layer extends further to be presented between the first, second metal pads and the first semiconductor layer of the first light emitting cell.

In one or more embodiments, the electrical insulation layer extends further to cover over a sidewall of the first and second light emitting cells.

In one or more embodiments, the transparent bonding layer is sandwiched between the second semiconductor layer of the first light emitting cell and the first semiconductor layer of the second light emitting cell.

In one or more embodiments, the hole has an opening at the first semiconductor layer of the first light emitting cell.

In one or more embodiments, the hole has a bottom at the second semiconductor layer of the second light emitting cell.

In one or more embodiments, the hole has a first inner diameter at the second light emitting cell and a second inner diameter at the transparent bonding layer, the second inner diameter is greater than the first inner diameter.

In one or more embodiments, the hole has a third inner diameter at the first semiconductor layer of the first light emitting cell, the third inner diameter is greater than the second inner diameter.

In one or more embodiments, a transparent conductive layer is located between the first metal pad and the first semiconductor layer of the first light emitting cell.

In one or more embodiments, a transparent conductive layer is located between the transparent bonding layer and the first semiconductor layer of the second light emitting cell.

In one or more embodiments, the first route metal is in contact with the transparent conductive layer.

In one or more embodiments, the exposed surface of the second light emitting cell is a roughened surface.

In one or more embodiments, the transparent bonding layer has a roughened surface.

In one or more embodiments, the transparent bonding layer is an electrical insulation layer.

In one or more embodiments, the first semiconductor layer is a p-type layer, and the second semiconductor layer is an n-type layer.

In one or more embodiments, the first light emitting cell and the second light emitting cell are free from a native support substrate.

In summary, the light emitting diode disclosed herein includes two light emitting cells that are bonded by a transparent bonding layer and electrically connected in series by a route metal. These two light emitting cells are vertically stacked to reserve more areas of the active layers in the light emitting diode.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
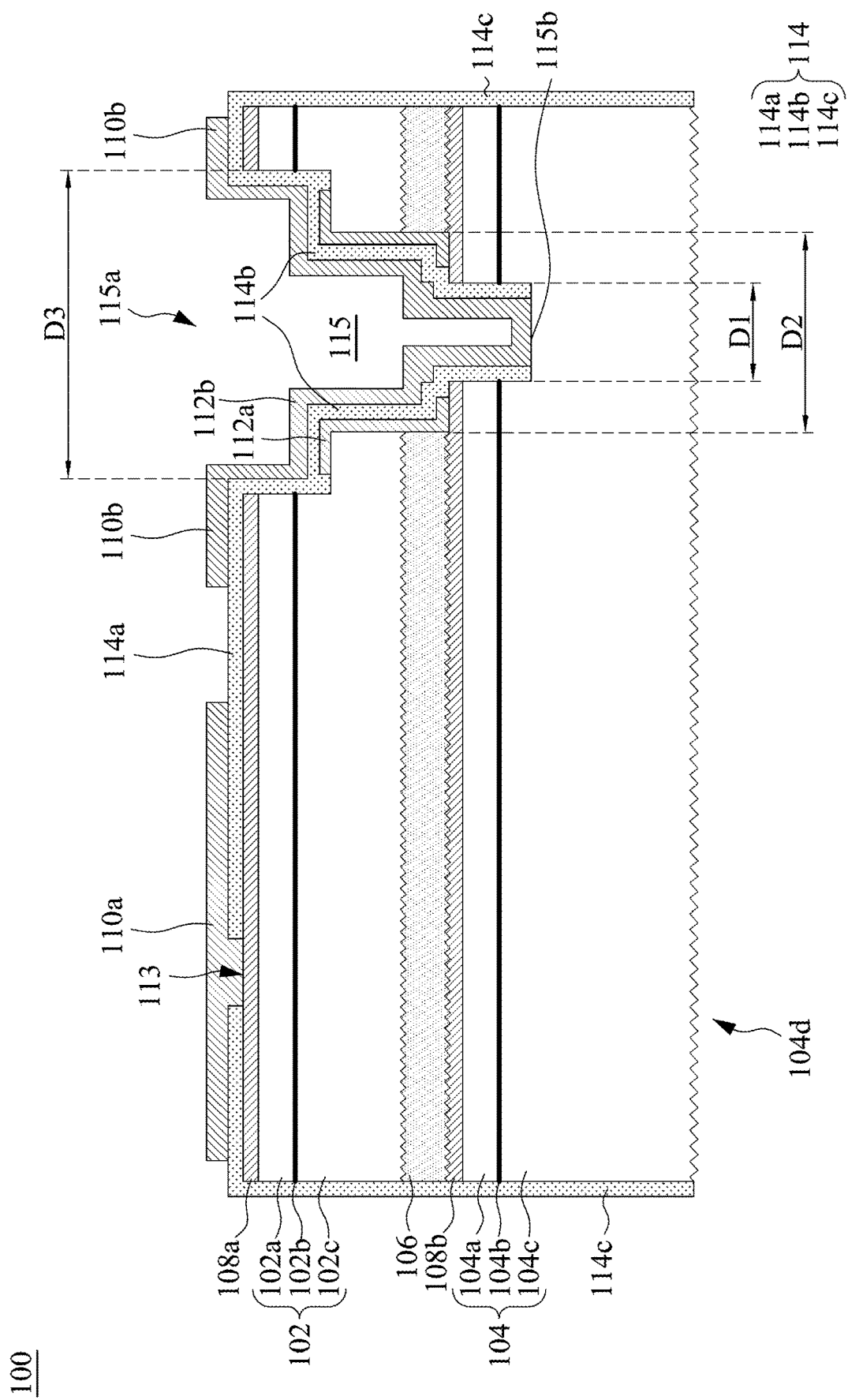
FIG. 1 illustrates a cross-sectional view of a light emitting device in accordance with an embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Referring to FIG. 1, which illustrates a cross-sectional view of an emitting diode in accordance with an embodiment of the present disclosure. A light emitting device 100 includes a first light emitting cell 102 and a second light emitting cell 104. Each light emitting cell includes a first semiconductor layer (102a, 104a), a second semiconductor layer (102c, 104c), and an active layer (102b, 104b) sandwiched between the first semiconductor layer (102a, 104a) and the second semiconductor layer (102c, 104c). In this embodiment, the first semiconductor layer (102a, 104a) may be a p-type semiconductor layer, and the second semiconductor layer (102c, 104c) may be an n-type semiconductor layer, but not being limited thereto. The active layer (102b, 104b) may have a single quantum well structure or a multi-quantum well structure.

In this embodiment, the first light emitting cell 102 and the second light emitting cell 104 can be micro LED chips that are free from their native support substrates, i.e., the native support substrates are removed, but not being limited thereto.

The first light emitting cell 102 and the second light emitting cell 104 are combined by a transparent bonding layer 106, and the second semiconductor layer 104c of the second light emitting cell 104 has an exposed surface 104d to serve as a light output surface. In particular, the transparent bonding layer 106 is sandwiched between the second semiconductor layer 102c of the first light emitting cell 102 and the first semiconductor layer 104a of the second light emitting cell 104. No metal pads are presented on the exposed surface 104d to impede the light output. In this embodiment, the exposed surface 104d of the second light emitting cell 104 may be a roughened surface, thereby enhancing the extraction efficiency of light produced in the active layers (102b, 104b). The transparent bonding layer 106 may also have roughened surfaces in contact with the second semiconductor layer 102c of the first light emitting cell 102 and a transparent conductive layer 108b to enhance light extraction efficiency. In this embodiment, the transparent bonding layer 106 may include benzocyclobutene materials, but not being limited thereto.

A metal pad 110a and a metal pad 110b may be located over a surface of the first semiconductor layer 102a of the first light emitting cell 102 that is opposite to the exposed surface 104d of the second light emitting cell 104. The metal pad 110b is spaced from the metal pad 110a and immediately-adjacent to or surrounding a single hole 115 that penetrates the first light emitting cell 102, the transparent bonding layer 106 and the second light emitting cell 104.

The single hole 115 has a top opening 115a at the first semiconductor layer 102a of the first light emitting cell 102 and a bottom 115b at the second semiconductor layer 104c of the second light emitting cell 104. The hole 115 has an inner diameter (D1) at the second light emitting cell 104, an inner diameter (D2) at the transparent bonding layer 106, and an inner diameter (D3) at the first semiconductor layer 102a of the first light emitting cell 102. The inner diameter (D3) is greater than the inner diameter (D2), and the inner diameter (D2) is greater than the inner diameter (D1).

Therefore, the hole 115 has a multi-step structure from the opening 115a to the bottom 115b.

Due to the different inner diameters within the hole 115, the active layer 104b of the second light emitting cell 104 has an area greater than that of the active layer 102b of the first light emitting cell 102. The active layer 104b of the second light emitting cell 104 is closer to the exposed surface 104d than the active layer 102b of the first light emitting cell 102.

A route metal 112a is formed on an inner sidewall of the hole 115 and electrically coupled to the second semiconductor layer 102c of the first light emitting cell 102 and the first semiconductor layer 104a of the second light emitting cell 104. In this embodiment, a transparent conductive layer 108b, e.g., an indium tin oxide film, may be formed between the transparent bonding layer 106 and the first semiconductor layer 104a of the second light emitting cell 104 thereby allowing current spreading over a wide area of the light emitting cells. The route metal 112a may be in contact with the transparent conductive layer 108b and further electrically coupled to the first semiconductor layer 104a of the second light emitting cell 104. Since the transparent bonding layer 106 is an electrical insulation layer, the route metal 112a serves as an electrical connection between the second semiconductor layer 102c of the first light emitting cell 102 and the first semiconductor layer 104a of the second light emitting cell 104.

Another route metal 112b is also formed within the hole 115 and electrically coupled to the metal pad 110b and the second semiconductor layer 104c of the second light emitting cell 104. The route metal 112b is spaced from the route metal 112a by a portion 114b of an electrical insulation layer 114. That is, the portion 114b of the electrical insulation layer 114 is sandwiched between the route metal 112a and the route metal 112b such that these two route metals are insulated from each other. In this embodiment, the route metal 112a is completely covered by the portion 114b of the electrical insulation layer 114. The route metal 112b has an upper end connected to the metal pad 110b and a lower end reached to the bottom 115b of the hole 115. Therefore, electrical currents can be applied via the metal pads (110a, 110b) and transferred to the first semiconductor layer 102a of the first light emitting cell 102 and the second semiconductor layer 104c of the second light emitting cell 104 respectively to form a series connection so as to excite the active layers (102b, 104b) of two light emitting cells (102, 104) to emit lights.

The electrical insulation layer 114 may have an extension portion 114a located between the metal pads (110a, 110b) and the first semiconductor layer 102a of the first light emitting cell 102. The electrical insulation layer 114 may further have an extension portion 114c to cover over a sidewall of the first and second light emitting cells (102, 104) as a passivation layer. A transparent conductive layer 108a, e.g., an indium tin oxide film, may be formed between the metal pad 110a and the first semiconductor layer 102a of the first light emitting cell 102. The extension portion 114a of the electrical insulation layer 114 has an opening 113 allowing the metal pad 110a to be in contact with the transparent conductive layer 108a.

Reference is made to FIGS. 2A-2G, which illustrates cross-sectional views of a method for manufacturing an LED in FIG. 1 in accordance with various embodiments of the present disclosure.

Figure 2B:
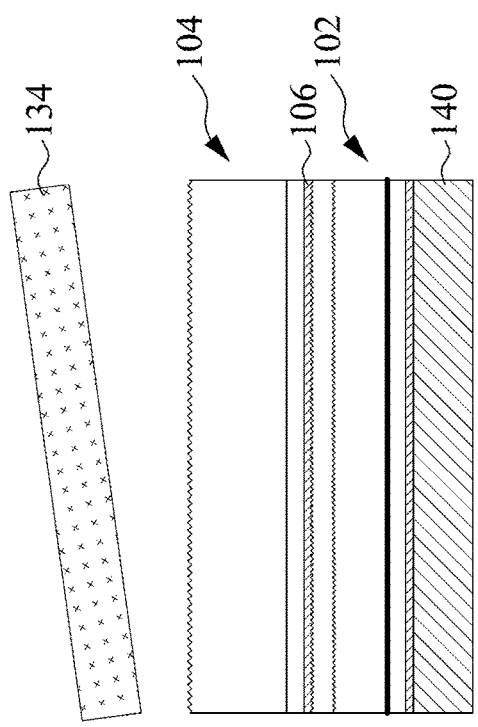
FIGS. 2A-2G illustrates cross-sectional views of a method for manufacturing an LED in FIG. 1 in accordance with various embodiments of the present disclosure.
Figure 2A:
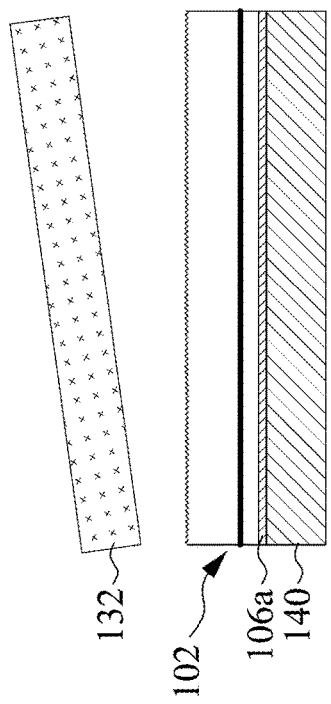

In FIG. 2A, the light emitting cell 102 on its native support substrate 132 is provided and attached to a sacrificial substrate 140 by a transparent bonding layer 106a. The light emitting cell 102 may include at least a first semiconductor layer, a second semiconductor layer, and an active layer sandwiched between the first semiconductor layer and the second semiconductor layer. The native support substrate 132 is then removed, e.g., by a laser lift-off process.

In FIG. 2B, the light emitting cell 104 on its native support substrate 134 is provided and attached to the light emitting cell 102 by the transparent bonding layer 106. The light emitting cell 104 may include at least a first semiconductor layer, a second semiconductor layer, and an active layer sandwiched between the first semiconductor layer and the second semiconductor layer. The native support substrate 134 is then removed, e.g., by a laser lift-off process.

Figure 2C:
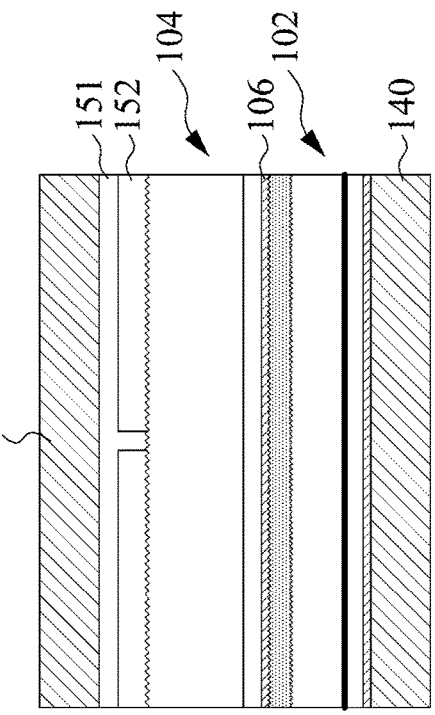

In FIG. 2C, a sacrificial substrate 150 is bonded to the light emitting cell 104 by an anchor layer 151 and a sacrificial layer 152.

Figure 2D:
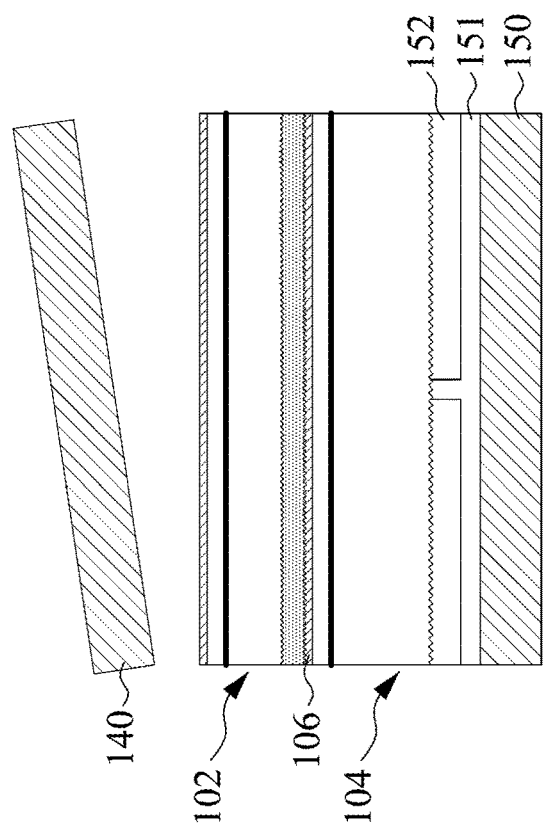

In FIG. 2D, the sacrificial substrate 140 and the transparent bonding layer 106a are removed, e.g., by a laser lift-off process.

Figure 2E:
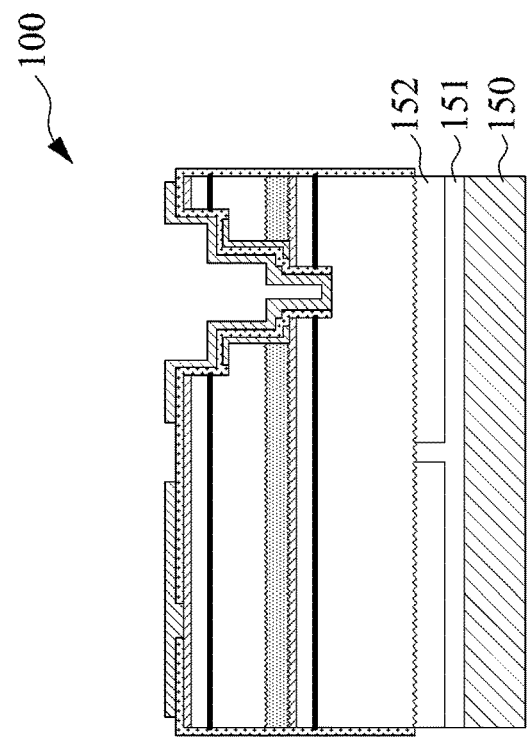

In FIG. 2E, a chip process is executed to form the route metals, the metal pads and the electrical insulation layers for two light emitting cells, thereby forming the light emitting device 100.

Figure 2G:
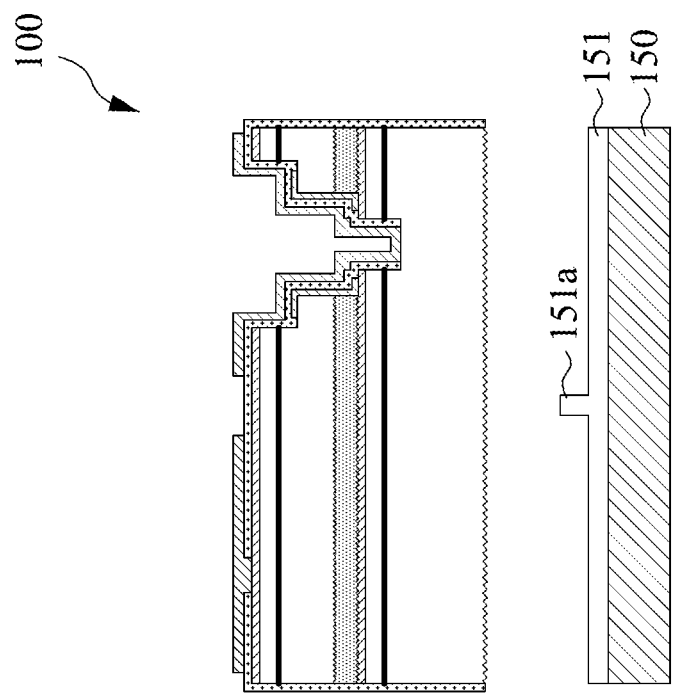
Figure 2F:
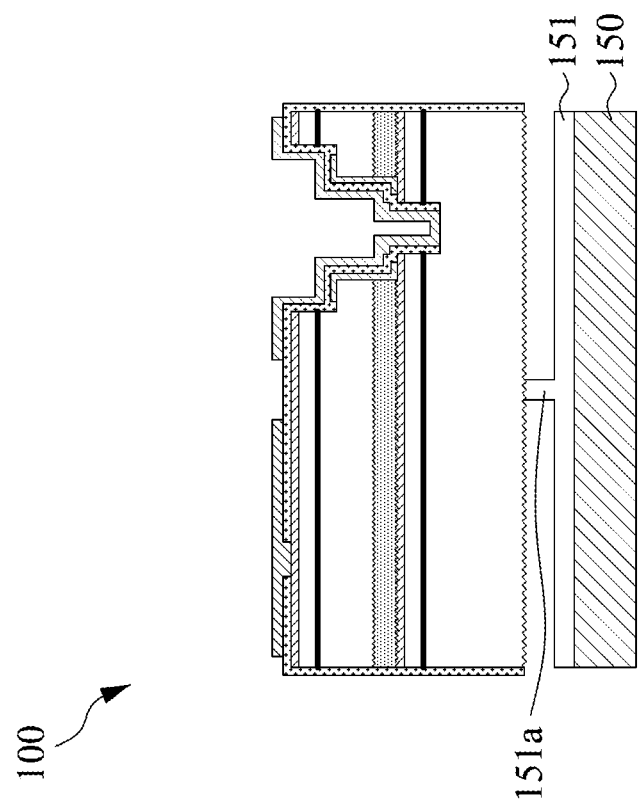

In FIG. 2F, the sacrificial layer 152 is removed by an etching process and the light emitting device 100 is connected to the anchor layer 151 by a break point 151a.

In FIG. 2G, a mass transfer step is executed to pick up the light emitting device 100 that is separated from the break point 151a of the anchor layer 151.

In summary, the light emitting diode disclosed herein includes two light emitting cells that are bonded by a transparent bonding layer and electrically connected in series by a route metal. These two light emitting cells are vertically stacked to reserve more areas of the active layers in the light emitting diode.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting device comprising:
a first light emitting cell and a second light emitting cell each comprising a first semiconductor layer, a second semiconductor layer, and an active layer disposed between the first semiconductor layer and the second semiconductor layer, wherein the second semiconductor layer of the second light emitting cell has an exposed surface to serve as a light output surface;
a first metal pad and a second metal pad both disposed over the first semiconductor layer of the first light emitting cell;
a transparent bonding layer disposed between the first light emitting cell and the second light emitting cell;
a hole formed on the first light emitting cell, the transparent bonding layer and the second light emitting cell;
a first route metal disposed on a sidewall of the hole and electrically coupled to the second semiconductor layer of the first light emitting cell and the first semiconductor layer of the second light emitting cell; and
a second route metal spaced from the first route metal and electrically coupled to the second metal pad and the second semiconductor layer of the second light emitting cell,
wherein the active layer of the second light emitting cell has an area greater than that of the active layer of the first light emitting cell.

2. The light emitting device of claim 1, wherein the active layer of the second light emitting cell is closer to the exposed surface than the active layer of the first light emitting cell.

3. The light emitting device of claim 1, wherein the second metal pad is spaced from the first metal pad and adjacent to the hole.

4. The light emitting device of claim 1 further comprising an electrical insulation layer disposed between the first route metal and the second route metal.

5. The light emitting device of claim 4, wherein the electrical insulation layer extends further to be disposed between the first, second metal pads and the first semiconductor layer of the first light emitting cell.

6. The light emitting device of claim 5, wherein the electrical insulation layer extends further to cover over a sidewall of the first and second light emitting cells.

7. The light emitting device of claim 1, wherein the transparent bonding layer is sandwiched between the second semiconductor layer of the first light emitting cell and the first semiconductor layer of the second light emitting cell.

8. The light emitting device of claim 1, wherein the hole has an opening at the first semiconductor layer of the first light emitting cell.

9. The light emitting device of claim 8, wherein the hole has a bottom at the second semiconductor layer of the second light emitting cell.

10. The light emitting device of claim 1, wherein the hole has a first inner diameter at the second light emitting cell and a second inner diameter at the transparent bonding layer, the second inner diameter is greater than the first inner diameter.

11. The light emitting device of claim 10, wherein the hole has a third inner diameter at the first semiconductor layer of the first light emitting cell, the third inner diameter is greater than the second inner diameter.

12. The light emitting device of claim 3 further comprising a transparent conductive layer disposed between the first metal pad and the first semiconductor layer of the first light emitting cell.

13. The light emitting device of claim 1 further comprising a transparent conductive layer disposed between the transparent bonding layer and the first semiconductor layer of the second light emitting cell.

14. The light emitting device of claim 13, wherein the first route metal is in contact with the transparent conductive layer.

15. The light emitting device of claim 1, wherein the exposed surface of the second light emitting cell is a roughened surface.

16. The light emitting device of claim 1, wherein the transparent bonding layer comprises a roughened surface.

17. The light emitting device of claim 1, wherein the transparent bonding layer is an electrical insulation layer.

18. The light emitting device of claim 1, wherein the first semiconductor layer is a p-type semiconductor layer, and the second semiconductor layer is an n-type semiconductor layer.

19. The light emitting device of claim 1, wherein the first light emitting cell and the second light emitting cell are free from a native support substrate.

* * * * *